United States Patent [19]

Brooks et al.

[11] Patent Number: 5,786,276
[45] Date of Patent: Jul. 28, 1998

[54] SELECTIVE PLASMA ETCHING OF SILICON NITRIDE IN PRESENCE OF SILICON OR SILICON OXIDES USING MIXTURE OF CH3F OR CH2F2 AND CF4 AND O2

[75] Inventors: Cynthia B. Brooks, Sunnyvale; Walter Merry, Cupertino; Ajey M. Joshi, San Jose; Gladys D. Quinones, Santa Clara; Jitske Trevor, Sunnyvale, all of Calif.

[73] Assignee: Applied Materials, Inc., Santa Clara, Calif.

[21] Appl. No.: 829,683

[22] Filed: Mar. 31, 1997

[51] Int. Cl.$^6$ .............................. B44C 1/22; H01L 21/302
[52] U.S. Cl. ..................... 438/724; 438/719; 438/723; 438/740
[58] Field of Search ........................ 438/724, 719, 438/723, 740

[56] References Cited

U.S. PATENT DOCUMENTS

| | | |
|---|---|---|
| 4,529,476 | 7/1985 | Kawamoto et al. ............... 156/643 |
| 4,654,114 | 3/1987 | Kadomura ........................ 156/643 |
| 5,201,994 | 4/1993 | Nonaka et al. ................... 156/643 |
| 5,318,668 | 6/1994 | Tamaki et al. ................... 156/662 |

FOREIGN PATENT DOCUMENTS 60-115231   6/1985   Japan.

*Primary Examiner*—R. Bruce Breneman
*Assistant Examiner*—George Goudreau
*Attorney, Agent, or Firm*—Fliesler, Dubb, Meyer & Lovejoy

[57] ABSTRACT

A chemical downstream etching (CDE) that is selective to silicon nitrides (SiN) over silicon oxides (SiO) uses at least one of a $CH_3F/CF_4/O_2$ recipe and a $CH_2F_2/CF_4/O_2$ recipe. Inflow rates are mapped for the respective components of the input recipe to find settings that provide both high nitride etch rates and high selectivity towards the SiN material. A pins-up scheme is used for simultaneously stripping away backside nitride with topside nitride.

18 Claims, 6 Drawing Sheets

SELECTIVE PLASMA ETCHING OF SILICON NITRIDE IN PRESENCE OF SILICON OR SILICON OXIDES USING MIXTURE OF CH3F OR CH2F2 AND CF4 AND O2

BACKGROUND

1. Field of the Invention

The invention is generally directed to plasma etching of silicon nitrides. The invention is more specifically directed to dry chemical downstream etching (CDE) selectively of silicon nitride (SiN) in the presence of silicon or silicon oxide using a plasma containing fluorine (F), hydrogen (H), carbon (C) and oxygen (O).

2. Cross Reference to Related Applications

The following copending U.S. patent application is assigned to the assignee of the present application, and its/ disclosures is incorporated herein by reference:

(A) Ser. No. 08/499,984 filed Jul. 10, 1995 by H. Herchen et al and entitled, "MICROWAVE PLASMA BASED APPLICATOR".

3. Cross Reference to Other Patents

The following U.S. or foreign patents are cited by way of reference:

(A) U.S. Pat. No. 4,529,476 issued Jul. 16, 1985 to Kawamoto et al and entitled "Gas for selectively etching silicon nitride and process for selectively etching silicon nitride with the gas";

(B) U.S. Pat. No. 4,654,114 issued Mar. 31, 1987 to Kadomura et al and entitled "Dry etching method for selectively etching silicon nitride existing on silicon dioxide";

(C) U.S. Pat. No. 4,857,140 issued Aug. 15, 1989 to Lowenstein and entitled "Method for etching silicon nitride";

(D) U.S. Pat. No. 4,820,378 issued Apr. 11, 1989 to Lowenstein and entitled "Process for etching silicon nitride selectively to silicon dioxide";

(E) U.S. Pat. No. 5,201,994 issued Apr. 13, 1993 to Nonaka et al and entitled "Dry etching method";

(F) U.S. Pat. No. 4,793,897 issued Dec. 27, 1988 to Dunfield et al and entitled "Selective thin film etch process"; and (G) U.S. Pat. No. 5,180,466 issued Jan. 19, 1993 to Shin and entitled "Dry etching silicon nitride using sulphur hexafluoride gas".

4. Cross Reference to Other Publications

The following other publications are cited by way of reference:

(A) L. M. Lowenstein, "Selective etching of silicon nitride using remote plasmas of $CF_4$ and $SF_6$", J. Vac. Sci. Technol. A, Vol 7, No. 3, May/June 1989, pgs 686–690; and (B) EPO publication 0_658_928_A1 June 1995, "Method of plasma etching silicon dioxide selectively to silicon nitride and polysilicon", by M. S. Barnes (IBM).

5. Description of the Related Art

During the manufacture of miniaturized devices such as integrated circuits (IC's) and the like, intermediate and/or final structures are often formed with combinations of patterned materials defined thereon where the combinations are composed of oxides and nitrides of silicon disposed adjacent to one another. The oxides and nitrides may be further disposed adjacent to monocrystalline, polycrystalline or other forms of silicon.

It is often times desirable to strip away or otherwise etch the silicon nitride material while not significantly etching into adjacent silicon or silicon oxide.

In commercial settings, the following parameters are usually considered important for mass-production stripping or etching of silicon nitride:

(1) etch rate of the silicon nitride (typically measured in Angstroms per minute or 'Å/min');

(2) selectivity for removal of silicon nitride over removal of silicon oxide or silicon (typically measured as the ratio of the respective etch rates for these materials);

(3) cross-wafer uniformity of etch depth in the silicon nitride layer (typically measured as a percentage of deviation);

(4) cross-wafer uniformity of etch depth, if any, in the silicon oxide layer; and (5) removability of solid or other residues.

In the past, silicon nitride was selectively removed by way of wet etching with hot phosphoric acid (e.g., 160° C.). Wet etching suffers from drawbacks such as: difficulty of filtering out unwanted particles from the viscous etch liquid; high cost of disposing of wet waste material; process control problems relating to variations in concentration of $H_3PO_4$ in the wet etch solutions over time; contamination problems; and problems associated with the high cost and low reliability of transferring wafers from wet etch baths to subsequent dry process stations.

As a result of such drawbacks, a number of workers in the field have begun to use dry plasma etching of silicon nitride instead of wet etching. Dry plasma etching often uses disassociated radicals of fluorine or of other halogens for etching quickly through the otherwise difficult-to-cut silicon nitride material.

Unfortunately, fluorine and other like halogen radicals are not highly selective and tend to etch even more quickly through adjacent silicon (Si) and silicon oxide (SiO) rather than through the silicon nitride (SiN).

A variety of methods have been tried with limited success for achieving selective etching of silicon nitride and for simultaneously realizing commercially acceptable balances between desirable results such as: (1) high silicon nitride etch rate, (2) high selectivity for silicon nitride over silicon oxide and/or over silicon, (3) good cross-wafer uniformity of etch depth in the silicon nitride layer, (4) low wafer temperature, (5) good process repeatability, (6) low process costs, and so forth.

The present application discloses an improved method and system for selective plasma etching of silicon nitrides in the presence of silicon or silicon oxides using a remote plasma containing fluorine (F), hydrogen (H), carbon (C) and oxygen (O).

SUMMARY OF THE INVENTION

In accordance with a first aspect of the invention, one or both of the gaseous compounds, $CH_3F$ (methyl fluoride) and $CH_2F_2$ (ethyl difluoride) are used in combination with $CF_4$ (carbon tetrafluoride) and $O_2$ (oxygen) to create a remote plasma. A downstream output (afterglow) of the plasma is applied to a wafer or other like workpiece that has exposed silicon nitride adjacent to exposed silicon oxide and/or exposed silicon.

In accordance with a second aspect of the invention, selective plasma afterglow etching with $CH_3F$, $CH_2F_2$, $CF_4$ and $O_2$ (one of first and second items optional) is followed by rinse with deionized $H_2O$ to remove an $NH_4F$ solid residue from the etched wafer (or other like workpiece).

More specifically, in one chemical downstream etching (CDE) system in accordance with the invention, the recipe ranges of Table 1A have been found to be particularly advantageous:

TABLE 1A

| Parameter | Range (center point plus or minus deviation) |
|---|---|
| Power (Watts) | 750 ± 50 |
| Pressure (milliTorr) | 500 ± 50 |
| $CF_4$ inflow (sccm) | 117 ± 15 |
| $O_2$ inflow (sccm) | 257 ± 15 |
| $CH_3F$ inflow (sccm) | 77 ± 10 |
| Chuck temperature (°C.) | 30 ± 5 |

Other parameters for the above Table 1A are:
RF frequency: 2.45 GHz and
Wafer backside Helium cooling pressure: 8 Torr. The central recipe point of Table 1A has been found to exhibit SiN etch rates of about 2500 Å/min or higher and selectivity for nitride over oxide of about 60 to 1 or greater.

In a second chemical downstream etching (CDE) system in accordance with the invention, the following recipes of Tables 1B and 1C have been found to be useful:

TABLE 1B

| Parameter | Range (center point plus or minus deviation) |
|---|---|
| Power (Watts) | 750 ± 50 |
| Pressure (milliTorr) | 480 ± 50 |
| $CF_4$ inflow (sccm) | 110 ± 15 |
| $O_2$ inflow (sccm) | 190 ± 10 |
| $CH_2F_2$ inflow (sccm) | 150 ± 10 |
| Chuck temperature (°C.) | 30 ± 5 |

TABLE 1C

| Parameter | Range (center point plus or minus deviation) |
|---|---|
| Power (Watts) | 750 ± 50 |
| Pressure (milliTorr) | 480 ± 50 |
| $CF_4$ inflow (sccm) | 280 ± 10 |
| $O_2$ inflow (sccm) | 80 ± 10 |
| $CH_2F_2$ inflow (sccm) | 100 ± 10 |
| Chuck temperature (°C.) | 30 ± 5 |

Other aspects of the invention will become apparent from the below detailed description.

BRIEF DESCRIPTION OF THE DRAWINGS

The invention will be described with reference to the following drawing(s) in which.

DETAILED DESCRIPTION

Figure 1:
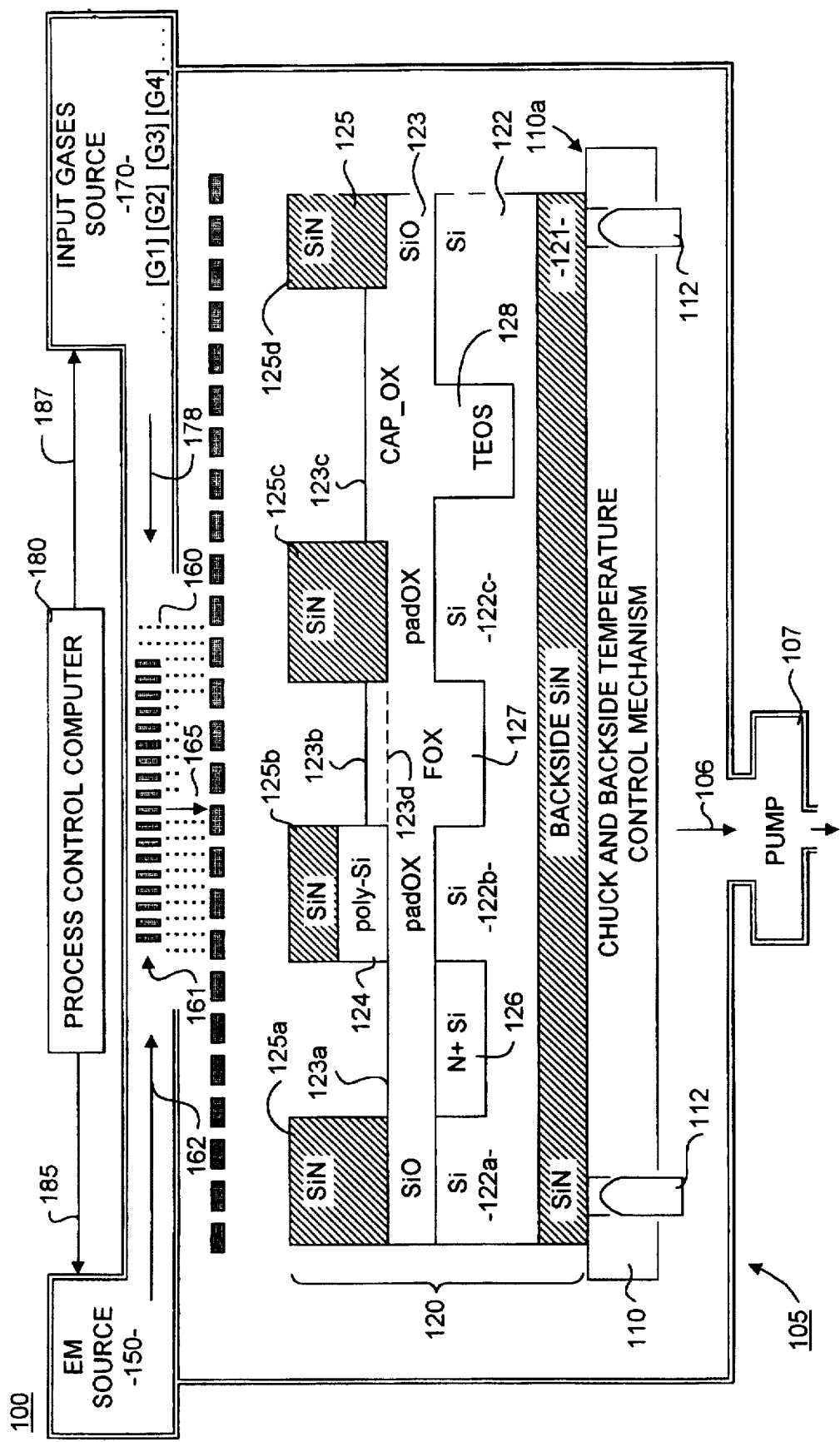
FIG. 1 is a cross-sectional schematic of a chemical downstream etching (CDE) system for carrying out a dry etch process in accordance with the invention.

FIG. 1 schematically shows in cross-section a chemical downstream etching (CDE) system 100 in accordance with the invention. (A more detailed mechanical description of the basic etching apparatus may be found for example in the above-cited application Ser. No. 08/499,984)

CDE system 100 includes a low-pressure chamber 105 within which there are provided, a plasma-forming means (e.g., applicator 161) and a wafer-supporting chuck 110.

The wafer-supporting chuck 110 may be used for temporarily holding a wafer 120 (or another like workpiece) in a predefined location within the low-pressure chamber 105. In one embodiment, a robotic blade (not shown) transports the wafer 120 to a position above a wafer-holding surface 110a of the chuck 110. Reciprocating pins 112 then rise to lift the wafer 120 off the blade. The blade retracts and the pins 112 are thereafter lowered to bring the wafer 120 down onto the wafer-holding surface 110a of the chuck. Electrostatic or other clamping means are then energized to clamp the backside (e.g., 121) of the wafer to the wafer-supporting chuck 110.

A temperature control means (not separately shown) may be provided within or in addition to the chuck 110 for maintaining a wafer backside temperature in the range of approximately 20° C. to 100° C. The backside temperature of wafer 120 is more preferably maintained at approximately 30° C. or less.

The wafer-temperature control means (not separately shown) can include for example a fluid-cooled heat exchange system such as a backside helium-flow cooling system integrated into the wafer-holding chuck 110.

Although not shown, additional temperature control means may be provided about the walls of the chamber 105 for controlling the temperatures of the inner surfaces of these chamber walls near the wafer 120. The additional temperature control means (not shown) may be in the form of electric heaters and/or heat exchange water jackets buried in the chamber walls between their inner and outer surfaces. Temperature sensors (not shown) may also be generally included in the chuck and/or in the chamber walls for determining the current temperatures of the wafer and of the inner surfaces of the chamber walls and for generating feedback signals for use in PID (proportional integral differential) feedback control of temperatures. The various temperature control means may be controlled in open or closed loop fashion by a process control computer 180.

The plasma-forming applicator 161 within the low-pressure chamber 105 is preferably positioned, gas flow-wise, 8 to 24 inches away from the wafer-holding surface 110a of chuck 110. Applicator 161 is used for producing thereat a remote plasma 160 (to be described shortly). The applicator 161 is spaced away from the wafer 120 such that the plasma 160 forms upstream of the wafer 120 without directly impinging on the wafer. One advantage of such remote formation of a plasma is that ballistic ions within the plasma 160 do not strike and thereby potentially damage the exposed surfaces of the downstream wafer 120. Another advantage of remote plasma formation is that high temperatures which typically develop within the interior of the plasma 160 are not contact-wise, or convection-wise, coupled directly to the downstream wafer 120 as may occur with directly impinging plasmas.

The on-chuck workpiece (e.g., wafer) 120 includes to-be-etched silicon nitride 125 positioned in the neighborhood of exposed silicon oxide surfaces such as 123a, 123b, 123c and/or positioned in the neighborhood of exposed silicon such as polycrystalline silicon region 124.

The to-be-etched silicon nitride may be in the form of a pre-patterned layer 125 of $Si_3N_4$ that has been deposited by way of, for example, chemical vapor deposition (CVD) or by other suitable means onto an underlying layer 123 of $SiO_2$. The to-be-etched silicon nitride may additionally or alternatively be in the form of a non-patterned layer 121 of $Si_3N_4$ that has been formed either on a neighboring layer of silicon 122 (as shown) or on a neighboring layer of silicon oxide (which latter configuration is not shown in FIG. 1).

FIG. 1 is atypical in that it seeks to depict a number of different application scenarios in a single illustration. Each scenario is one in which it might be desirable to selectively etch silicon nitride in the presence of exposed silicon oxide or exposed silicon. It is to be understood that typically only one or a few, rather than all of these application scenarios are present in a given instance. FIG. 1 attempts to compress the different scenarios into a single illustration for brevity's sake.

In the examples set forth by FIG. 1, the on-chuck workpiece 120 includes a bulk substrate 122/123 to which one or more silicon nitride layers such as 121 and 125 are attached either directly or indirectly. The bulk substrate 122/123 may be composed of one or more semiconductive or insulative materials such as monocrystalline silicon (mono-Si) 122 or polycrystalline silicon (poly-Si) 124 or amorphous silicon (a-Si, not shown) or sapphire or other forms of silicon oxide ($SiO_2$) 123. Other bulk substrate materials are of course possible.

A first application scenario is represented by portions 127, 123b, 123d, 125c, and 122c of FIG. 1.

In this first application scenario, silicon nitride (SiN) as represented generally by 125 has been formed on a thin portion (pad__OX) of thermally pre-grown $SiO_2$. The silicon oxide is represented generally by the designation, 125. During or after formation, the silicon nitride has been patterned into an $Si_3N_4$ island 125c. At an edge (e.g., left side) of SiN island 125c there was exposed a surface portion 123d (shown by dashed line) of the underlying pad__OX. The wafer 120 was thereafter exposed to an oxidizing environment which produced a thicker field-oxide (FOX) portion 123b/127 extending below and above the earlier-exposed surface portion 123d. Silicon nitride island 125c served as an oxidation stop during the field-oxide growth step and as such protected its underlying silicon region 122c from being oxidized.

Portions 127, 123b, 123d, 125c, and 122c of FIG. 1 represent the next state wherein it is desirable to selectively remove the silicon nitride island 125c while preserving FOX portion 123b/127 and the pad__OX over silicon region 122c.

A second, so-called 'PBL' application scenario is represented by portions 124, 125b, 122b, 123b and 127 of FIG. 1. A polycrystalline silicon layer 124 has been formed on a thin portion (pad__OX) of pre-formed $SiO_2$ 123. Silicon nitride has been formed on top of the poly-Si layer 124. The formed poly-Si and $Si_3N_4$ were patterned to create an island 124/125b having an edge (e.g., right side of 124/125b) at which portion 123d of the underlying pad__OX was exposed. The wafer 120 was thereafter exposed to an oxidizing environment and this produced the thicker field-oxide (FOX) portion 123b/127 at the side of the poly-Si/nitride island 124/125b. Silicon nitride portion 125c has served as an oxidation stop and as such has protected both the covered poly-Si portion 124 and underlying silicon region 122b from being oxidized. FIG. 1 shows the next state wherein it is desirable to selectively remove nitride portion 125b (and optionally also poly-Si portion 124) while preserving FOX portion 123b/127 and the pad__OX over silicon region 122b.

A third possible application scenario is represented by portions 128, 123c, 125c, and 122c of FIG. 1. A trench has been formed at 128 extending into mono-Si substrate 122. The trench has been filled with a CVD oxide that was produced using TEOS (tetraethylorthosilicate) as a CVD feed gas. The wafer 120 was thereafter exposed to an oxidizing environment which produced a capping-oxide (CAP__OX) 123c over the TEOS oxide trench 128. Silicon nitride islands 125c and 125d served as oxidation stops during the CAP__OX growth step and as such protected their respective underlying silicon regions from being oxidized. FIG. 1 shows the next state wherein it is desirable to selectively remove silicon nitride islands 125c and 125d while preserving CAP__OX portion 123c.

A fourth possible application scenario is represented by portions 126, 123a, 125a and/or 125b/124, and 122a/122b of FIG. 1. Pad__OX layer 123 has been grown on mono-Si layer 122. Silicon nitride has been formed on the thin pad__OX. Poly-Si layer 124 was optionally deposited beforehand or not. The silicon nitride has been patterned into the form of $Si_3N_4$ islands 125a and/or 125b, between which there was an exposed surface portion 123a of the pad__OX. The wafer 120 was thereafter exposed to ion implantation. The dopants of the ion implantation penetrated into region 126 of the underlying mono-Si 122. Islands 125a and/or 125b/124 served as implant masks that blocked the ion implantation from penetrating into respective regions 122a and 122b of the underlying mono-Si. FIG. 1 shows the next state wherein it is desirable to selectively remove silicon nitride islands 125a and/or 125b while preserving pad__OX portion 123a.

A fifth possible application scenario is represented by portion 121 and any one or more of portions 125a, 125b, 125c, 125d. At the same time that silicon nitride was deposited onto a topside portion of wafer 120 for forming any one or more of portions 125a, 125b, 125c, 125d; silicon nitride was also deposited onto the backside portion of wafer 120 to thereby form the backside SiN layer 121. FIG. 1 shows a state wherein it may be desirable to selectively remove the backside SiN layer 121 in the same chamber 105 used for selectively removing any one or more of SiN portions 125a, 125b, 125c, and 125d.

In accordance with one embodiment of the invention, a remote plasma 160 is struck and fed with input gases consisting of: $CH_3F$ or $CH_2F_2$, and $CF_4$ and $O_2$. The plasma afterglow 165 is flowed by the exposed SiN and SiO or Si surfaces of the wafer 120 to provide selective removal of the SiN material.

During the SiN etching process, chamber 105 is appropriately sealed to maintain pressures therein at least as low as 3 Torr to 300 mTorr, and more preferably 100 mTorr base pressure in the vicinity of workpiece 120. A vacuum means 107 such as a mechanical pump is provided to exhaust gases from chamber 105 and to thereby create the desired pressure within the chamber (e.g., 300 mTorr or less). Vector 106 generally represents outflowing gases of the chamber which are removed by vacuum means 107.

A source of high frequency electromagnetic radiation (EM source) 150 is provided and operatively coupled to the applicator 161 of the low-pressure chamber 105 for striking and maintaining the remote plasma 160. In one embodiment, EM source 150 is capable of outputting a 2.45 GHz EM field at a power level of approximately 750 Watts or greater. This high frequency EM energy is coupled to the applicator 161 of the chamber by an electrically matched waveguide 162. Other frequencies, power levels and methods of energy coupling may of course be used as appropriate. The plasma energizing EM radiation may be of multiple frequencies instead of just a single frequency.

A gas supply means 170 is further provided and operatively coupled to the low-pressure chamber 105 for supplying a selected one or a selected combination 178 of gases at respective flow rates into chamber 105.

The selectable gases (only four shown as G1–G4, but there can be more) in accordance with the invention include $CH_3F$ and/or $CH_2F_2$, and $CF_4$, and $O_2$. The selectable gases may further include inert carriers such as argon (Ar) or helium ($He_2$), and even nitrogen ($N_2$).

Gas supply means 170 may include one or more flowrate control means (e.g., manually or electrically controlled valves—not shown) for regulating the respective inflow rates of a respective one or more of the selectable gases G1–G4.

The combined input gas stream 178 may, but preferably does not, contain carrier gases such as argon, helium or nitrogen. It has been found that there is little advantage to including carrier gases and that their inclusion merely adds to the work load of exhaust pump 107, it merely adds to the cost of materials consumed, and that more reliability and maintenance problems are encountered by the accompanying valves and gas sources Gn without any significant benefit. However, one may use one or more such carrier gases in the inflow stream 178 if desired.

The EM source 150, the gas supply means 170, and the pump 107 are preferably controlled automatically by the process control computer 180 so as to maintain program defined levels of plasma energizing power, program defined levels of gas inflow rates, and program defined levels of chamber pressure. Connections 185 and 187 are understood to represent the various operative couplings between process control computer 180 and remaining portions of system 100 that are monitored and/or controlled by computer 180.

The energy of EM source 150 is coupled to the inflow gas stream 178 at the 'applicator' region 161 at sufficient intensity (volts/cm) to strike and thereafter maintain the plasma 160. The EM energy causes the molecules of one or more of the inflowing gases 178 to disassociate into respective submolecular constituents (e.g., free radicals or free ions such as $CH_3F^*$ or $CHF_2^*$ or $CF_3^*$ or $F^*$, where '*' indicates a free radical).

The thus produced submolecular constituents (e.g., free radicals) of the plasma 160 flow downstream as indicated by vector 165 towards the exposed surfaces 125a, 125b, etc., of the to-be-etched, remotely located, silicon nitride 125.

Typically, a gas distribution plate 140 is provided between the applicator 161 and the wafer 120 for more uniformly applying the plasma afterglow 165 to the exposed surfaces 125a, 125b, etc. of the wafer.

Selective etching that favors etching away of exposed silicon nitride over etching away of exposed silicon oxide is believed to occur by way of one or more of the following reactions:

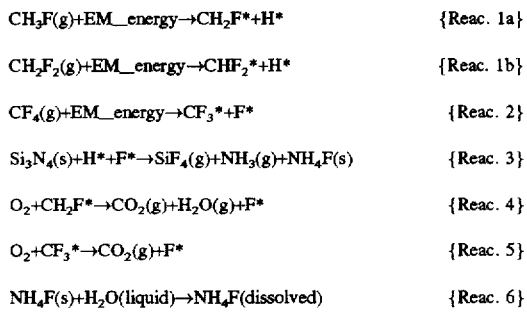

| | |
|---|---|
| $CH_3F(g)+EM\_energy \rightarrow CH_2F^*+H^*$ | {Reac. 1a} |
| $CH_2F_2(g)+EM\_energy \rightarrow CHF_2^*+H^*$ | {Reac. 1b} |
| $CF_4(g)+EM\_energy \rightarrow CF_3^*+F^*$ | {Reac. 2} |
| $Si_3N_4(s)+H^*+F^* \rightarrow SiF_4(g)+NH_3(g)+NH_4F(s)$ | {Reac. 3} |
| $O_2+CH_2F^* \rightarrow CO_2(g)+H_2O(g)+F^*$ | {Reac. 4} |
| $O_2+CF_3^* \rightarrow CO_2(g)+F^*$ | {Reac. 5} |
| $NH_4F(s)+H_2O(liquid) \rightarrow NH_4F(dissolved)$ | {Reac. 6} |

In above reactions, Reac. 1a and 1b, free protons (H*) are produced by in-plasma disassociation of the inflowing $CH_3F$ and/or $CH_2F_2$ gas(es).

In above reaction Reac. 2, free fluorine radicals (F*) are produced by in-plasma disassociation of the inflowing $CF_4$ gas. Of course, other in-plasma disassociations may take place for further producing free protons (H*) and free fluorine radicals (F*).

The free H* and F* particles flow downstream to react with the exposed surfaces 125a, 125b, etc. of silicon nitride. Reac. 3 is believed to produced volatile byproducts $SiF_4(g)$ and $NH_3(g)$ as well as a solid residue of $NH_4F$. The $NH_4F$ residue is believed to be porous since it does not appear to stop continued etthching. Some of the $NH_4F$ residue is left behind at the end of etching, thereby indicating that it is produced.

In reactions Reac. 4 and Reac. 5, the carbon portion of fluoro-hydrocarbons such as $CH_2F^*$ or $CHF_2^*$ is believed to combine with the inflowing oxygen (or O* radicals) to produce $CO_2$. The freed hydrogen is believed to combine with the oxygen to form $H_2O$ gas.

It has been found that after plasma etching, some solid residue of $NH_4F$ still remains on the wafer in the region of silicon nitride 125. This residue of $NH_4F$ is preferably removed after etching by rinsing the wafer 120 with deionized water. Reaction Reac. 6 represents the removal of the solid $NH_4F$ residue by rinsing away with an $H_2O$ wash or with another appropriate solvent.

In the case of the second application scenario (PBL), if desired, the polycrystalline silicon layer 124 can be etched in the same chamber 105, after removal of the silicon nitride, using a conventional plasma-feed recipe such as $CF_4$, $O_2$ and $Cl_2$.

Furthermore, in the case of the fifth application scenario, if desired, the backside SiN layer 121 can be etched in the same chamber 105 by going into a 'pins-up mode'. In the 'pins-up mode', the wafer clamping function of wafer-holding chuck 110 is deactivated and pins 112 are raised so as to space the backside SiN layer 121 away from wafer-holding surface 110a of the chuck. The $CH_3F$ and/or $CH_2F_2$ recipe is then used to selectively etch the now-exposed, backside SiN layer 121 either separately or simultaneously with selective etching of the topside silicon nitride 125.

Figure 2:
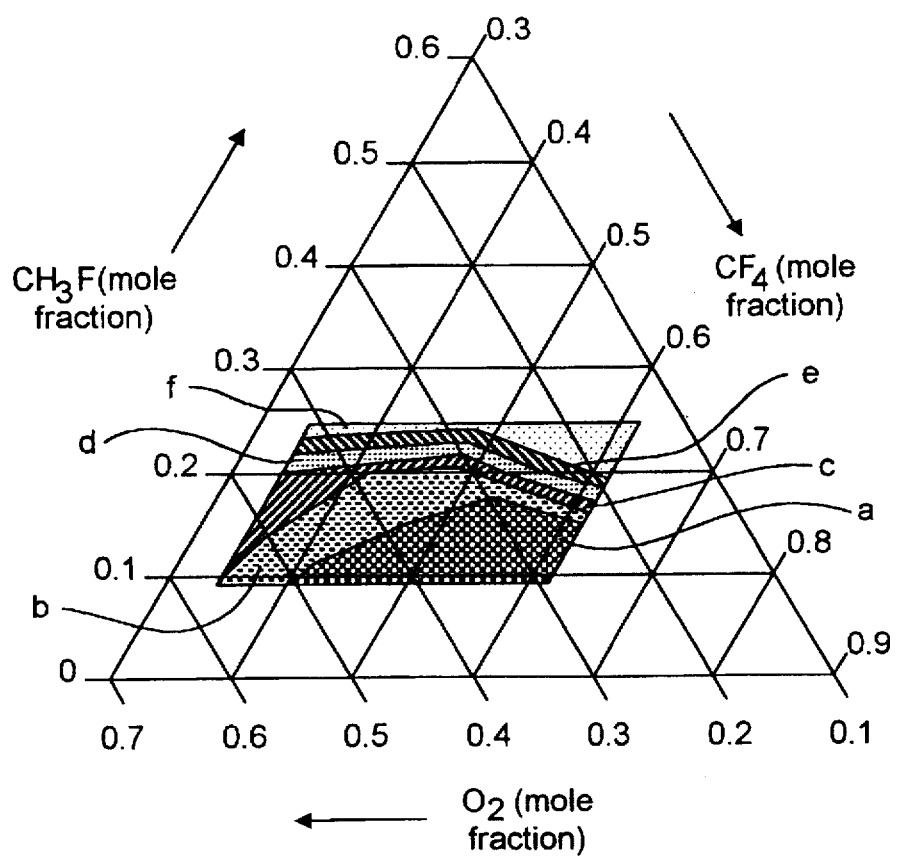
FIG. 2 is a plot showing experimental results of SiN etch rate over a range of plasma feed parameters for three input gases.
Figure 2:
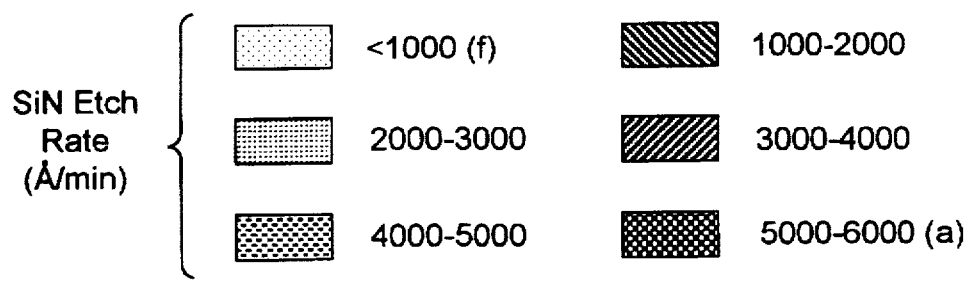

FIG. 2 is a first plot showing SiN etch rate results for experiments carried out over the input parameter window defined by below Table-2A. Total flow rates for the mixtures were varied over the range of 350 sccm to 600 sccm and results were normalized into terms of mole fractions. (Mole fraction of gas X equals flow rate of gas X divided by total mixture flow rate.) It is to be understood that the mole fraction values provided herein are subject to some round-off error and thus the sum of given mole fractions for any given experimental run may be slightly off from the ideal value of 1.00.

TABLE 2A

Experimental Window for CH₃F/CF₄/O₂ recipe

| Input Gas | Experiment Low End (Mole fraction) | Experiment High End (Mole fraction) |
|---|---|---|
| $CH_3F$ | 0.09 | 0.25 |
| $CF_4$ | 0.34 | 0.62 |
| $O_2$ | 0.13 | 0.57 |

Parameters
Power=750 W at 2.45 GHz
Pressure=400–500 mTorr
Cathode temp=25° C.–30° C.
SiN/SiO exposed area ratio approx 1:1

The experimental window (Table-2A) of FIG. 2 is divided into regions representing respectively observed SiN etch rates in the respective ranges of: (a) between 5000 and 6000 Å/min; (b) between 4000 and 5000 Å/min; (c) between 3000 and 4000 Å/min; (d) between 2000 and 3000 Å/min; (e) between 1000 and 2000 Å/min; and (f) less than 1000 Å/min.

As seen in FIG. 2, the more desirable, higher SiN etch rates (e.g., regions a and b) are found generally in the lower half of the experimental window (e.g., $CH_3F$ mole fraction less than about 0.2) and more so in terms of greater tolerance to process variability, closer to the lower left corner (e.g., $O_2$ mole fraction <0.3, OR $CF_4$ mole fraction >0.5).

Figure 3:
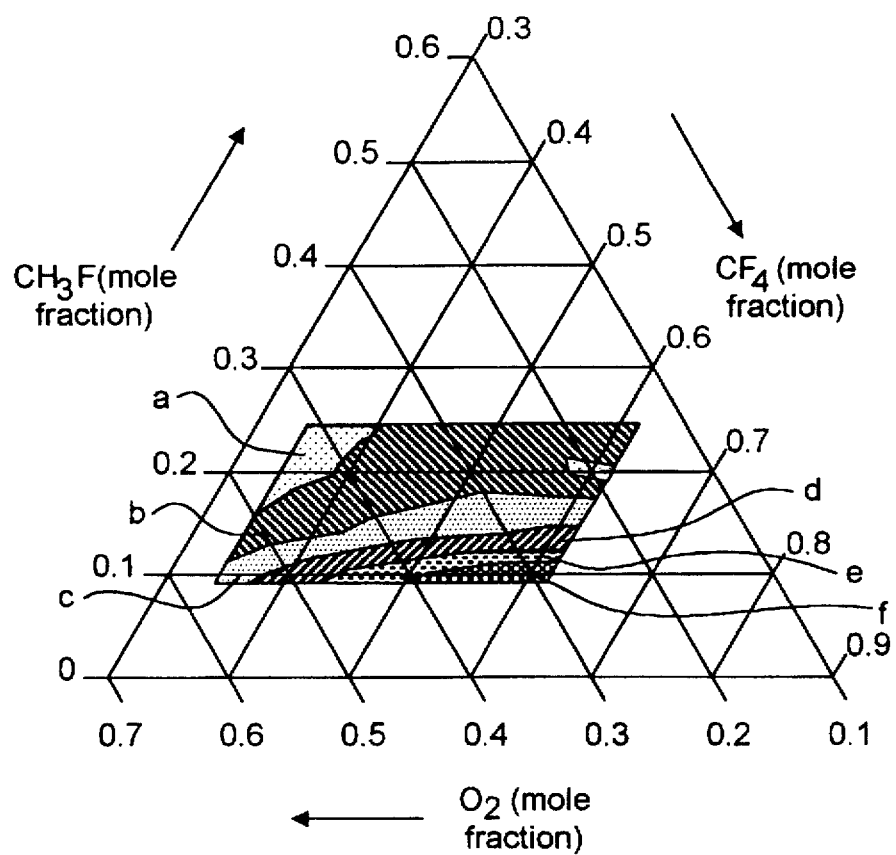
FIG. 3 is a plot showing experimental results of SiO etch rate over a range of plasma feed parameters for the three input gases of FIG. 2.
Figure 3:
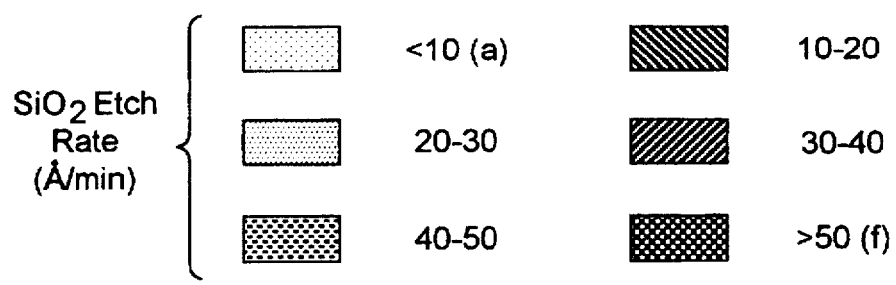

FIG. 3 is a second plot showing SiO etch rate results for the same experiments carried out over the same input parameter window defined by Table-2A.

The experimental window (Table-2A) of FIG. 3 is divided into regions representing respective SiO etch rates in the respective ranges of: (a) less than 10 Å/min; (b) between 10 and 20 Å/min; (c) between 20 and 30 Å/min; (d) between 30 and 40 Å/min; (e) between 40 and 50 Å/min; and (f) greater than 50 Å/min.

As seen in FIG. 3, the less desirable, higher SiO etch rates (e.g., '(f)' and '(e)') are found generally toward the lower right corner of the experimental window and moderate to lower SiO etch rates (e.g., '(b)' and '(a)') are found generally towards the upper left corner. The moderate to lower SiN etch rates include the window region characterized by: $CH_3F$ mole fraction >0.18. In terms of greater tolerance to process variability, the region characterized by $O_2$ mole fraction >0.3 is preferred because it includes the large '(a)' region. Alternatively, a similar region could have been carved out for FIG. 3 by setting $CF_4$ mole fraction <0.4. However the latter approach also eliminates the higher SiN etch rate region '(a)' of FIG. 2 and thus does not work well as a strategy when one wishes to obtain both a high SiN etch rate (e.g., greater than 1000 Å/min) and good nitride to oxide selectivity.

Figure 4:
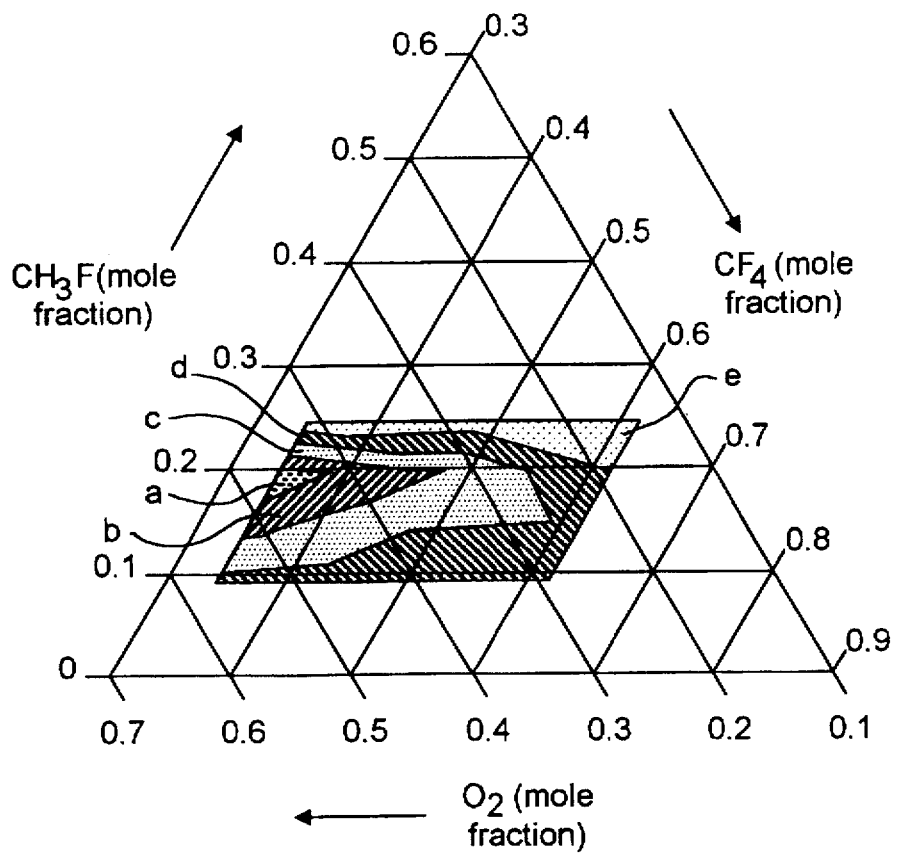
FIG. 4 is a plot showing experimental results of SiN/SiO etch rate ratio over a range of plasma feed parameters for the three input gases of FIG. 2.
Figure 4:
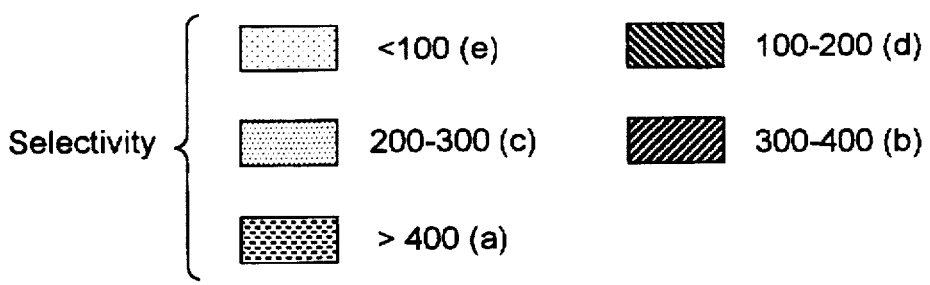

FIG. 4 is a third plot showing the nitride to oxide selectivity as defined by:

$$\text{Selectivity} = \frac{\text{Etch rate of SiN (in Å/minute)}}{\text{Etch rate of SiO (in Å/minute)}}$$

The SiN/SiO etch rate ratios are from the results of the same experiments carried out over the same input parameter window defined by Table-2A.

The experimental window of FIG. 4 is divided into regions representing respective selectivity values in the respective ranges of: (a) greater than 400 to one; (b) between 300:1 and 400:1; (c) between 200:1 and 300:1; and (d) between 100:1 and 200:1; (e) less than 100:1.

As seen in FIG. 4, the higher SiN/SiO etch rate ratios (e.g., of the '(a)' and '(b)' type) are found generally toward the left edge of the experimental window, particularly near the region characterized by: $CH_3F$ mole fraction less than 0.22. The highest '(a)' type of selectivity is found in the region characterized by: $CH_3F$ mole fraction equal to 0.18 to 0.22; $CF_4$ mole fraction <0.4; and $O_2$ mole fraction >0.4.

It is desirable to balance the options presented by FIGS. 2 and 4 so that both high SiN etch rates and good nitride versus oxide selectivity is obtained. High SiN etch rates are defined herein as at least about 1000 Å/min, and more preferably at least about 2000 Å/min, and even more preferably at least about 2500 Å/min. Good nitride versus oxide selectivity is defined herein as at least about 50:1, and more preferably at least about 80:1, and even more preferably at least about 100:1. As seen in FIG. 4, except for region (e), exceptionally good nitride versus oxide selectivity is obtained in the experimental window. As seen in FIG. 2, regions (a) through (d) qualify as providing high etch rates.

Figure 5:
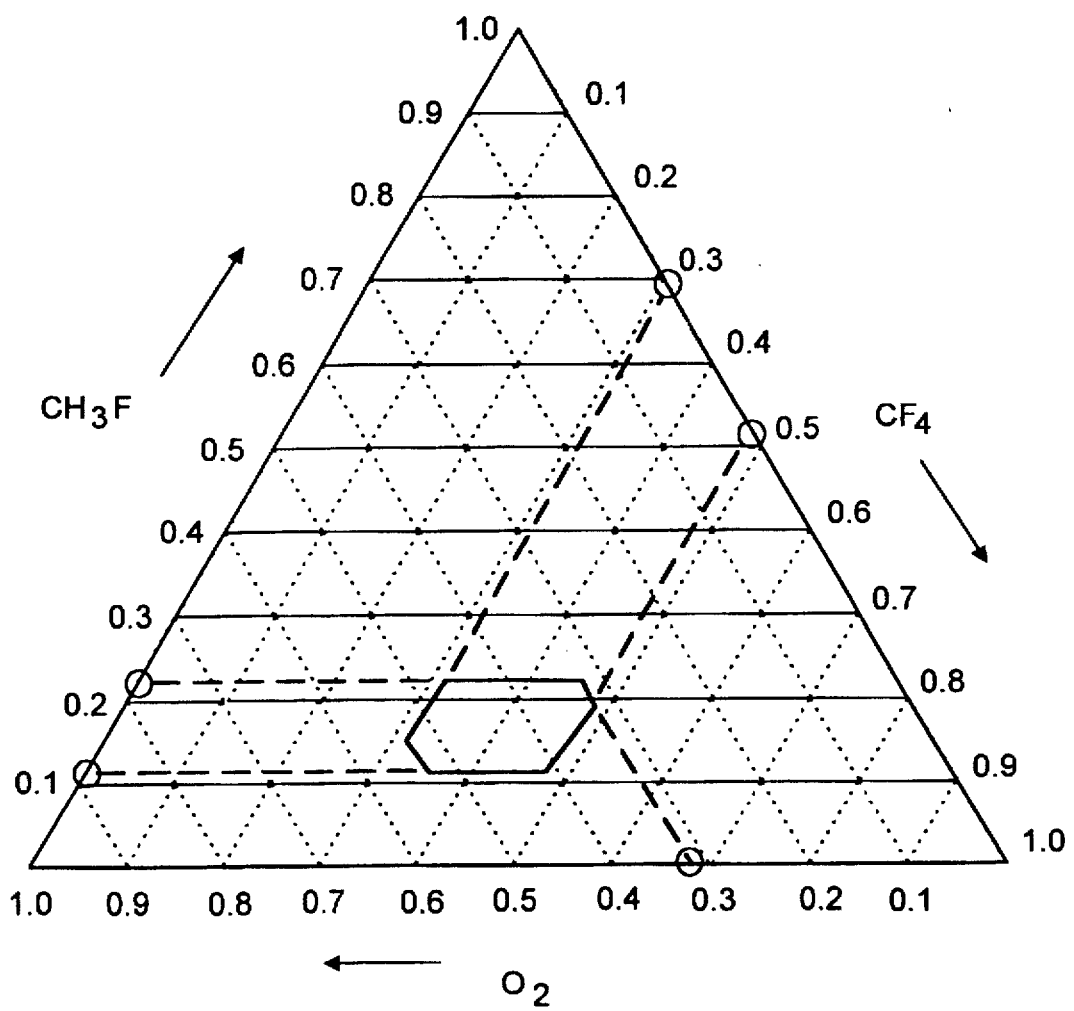
FIG. 5 is a plot indicating preferred operating ranges for achieving improved SiN etch rate and improved selectivity over SiO within the illustrated range of plasma feed parameters for the $CH_3F/CF_4/O_2$ recipe.

FIG. 5 is a fourth plot showing the experimental window partitioned to include a preferred region defined by below Table-2B wherein total flow rate of the three mixed gases is in the range 350 sccm to 600 sccm:

TABLE 2B

Preferred Ranges for CH₃F/CF₄/O₂ recipe

| Input Gas | Metric | Preferred Low End of Window | Preferred High End of Window |
|---|---|---|---|
| $CH_3F$ | mole fraction | 0.120 | 0.220 |
| | min contrib to Total flow | 42 sccm | 77 sccm |
| | max contrib to Total flow | 72 sccm | 132 sccm |
| $CF_4$ | mole fraction | 0.300 | 0.480 |
| | min contrib to Total flow | 105 sccm | 168 sccm |
| | max contrib to Total flow | 180 sccm | 288 sccm |
| $O_2$ | mole fraction | 0.320 | 0.550 |
| | min contrib to Total flow | 112 sccm | 192.5 sccm |
| | max contrib to Total flow | 192 sccm | 330 sccm |

When the region of Table 2B is superimposed on each of FIGS. 2 and 4, it is seen that a combination of high SiN etch rate and good SiN/SiO selectivity is obtained.

Table-2C illustrates three points in terms of sccm that are in accordance with the invention.

TABLE 2C

Preferred Points for CH₃F/CF₄/O₂ recipe

| Input Gas | Point 1 | Point 2 | Point 3 |
|---|---|---|---|
| $CH_3F$ | 94 sccm | 86 sccm | 77 sccm |
| $CF_4$ | 187 sccm | 220 sccm | 117 sccm |
| $O_2$ | 270 sccm | 144 sccm | 257 sccm |

Further experiments were carried out over the input parameter window defined by below Table-3A. Total flow rates for the mixtures were varied over the range of 350 sccm to 600 sccm and results were normalized into terms of mole fractions. (Mole fraction of gas X equals flow rate of gas X divided by total mixture flow rate.)

TABLE 3A

Experimental Window for $CH_2F_2/CF_4/O_2$ recipe

| Input Gas | Experiment Low End (Mole fraction) | Experiment High End (Mole fraction) |
|---|---|---|
| $CH_2F_2$ | 0.11 | 0.89 |
| $CF_4$ | 0.12 | 0.89 |
| $O_2$ | 0.00 | 0.42 |

Parameters

Power=750 W at 2.45 GHz

Pressure=480 mTorr

Cathode temp=30° C.

Backside helium cooling pressure: 8 Torr

SiN/SiO exposed area ratio approx 1:1

Figure 6:
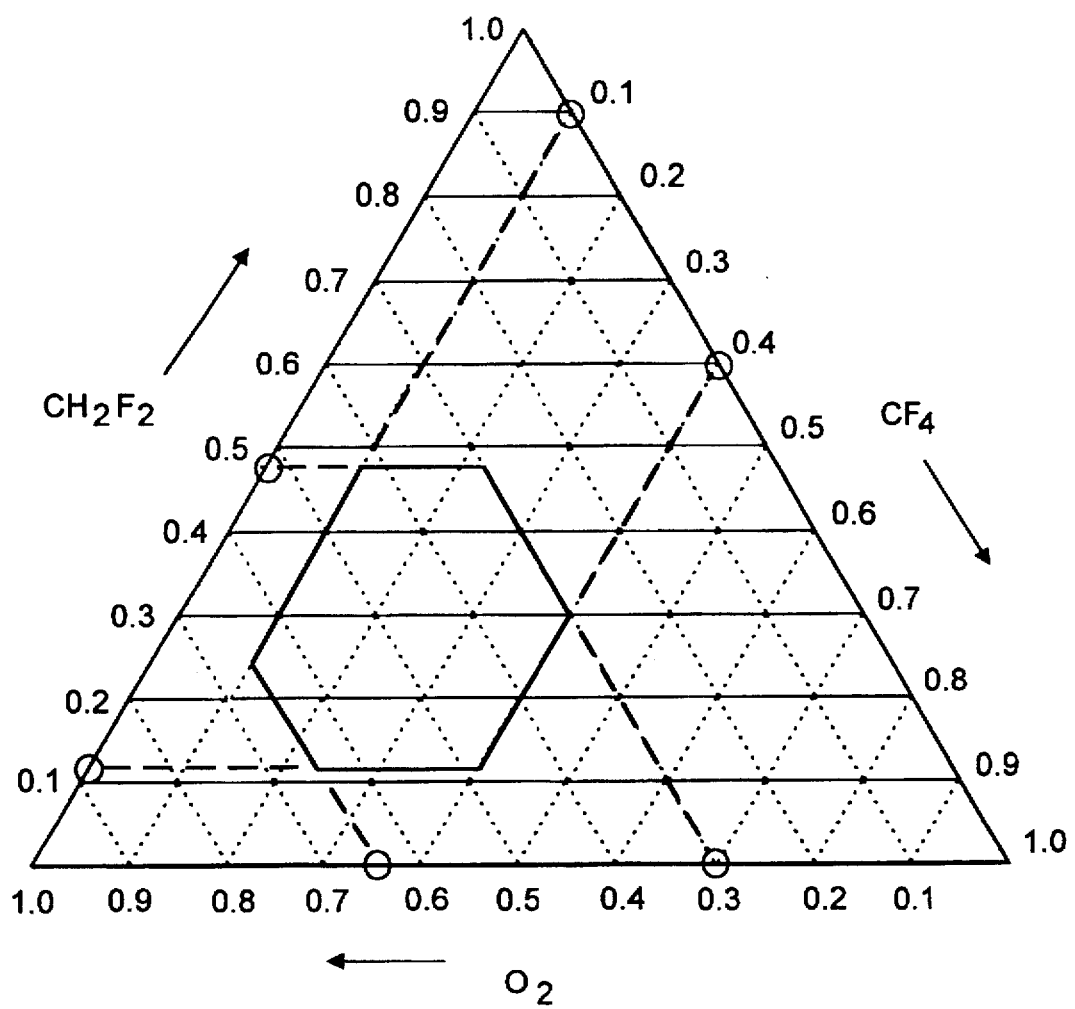
FIG. 6 is a plot indicating preferred operating ranges for achieving improved SiN etch rate and improved selectivity over SiO within the illustrated range of plasma feed parameters for the $CH_2F_2/CF_4/O_2$ recipe.

FIG. 6 is another plot showing the experimental window partitioned to include a preferred region defined by below Table-3B wherein total flow rate of the three mixed gases is in the range 350 sccm to 600 sccm:

TABLE 3B

Preferred Ranges for $CH_2F_2/CF_4/O_2$ recipe

| Input Gas | Metric | Preferred Low End of Window | Preferred High End of Window |
|---|---|---|---|
| $CH_2F_2$ | mole fraction | 0.12 | 0.48 |
| | min contrib to Total flow | 42 sccm | 168 sccm |
| | max contrib to Total flow | 72 sccm | 288 sccm |
| $CF_4$ | mole fraction | 0.10 | 0.40 |
| | min contrib to Total flow | 35 sccm | 140 sccm |
| | max contrib to Total flow | 60 sccm | 240 sccm |
| $O_2$ | mole fraction | 0.30 | 0.65 |
| | min contrib to Total flow | 105 sccm | 227.5 sccm |
| | max contrib to Total flow | 180 sccm | 390 sccm |

Table 3B and FIG. 6 were developed from the experimental results of below Table-3C and Table-3D. An extensive number of experiments have not yet been performed for the $CH_2F_2$ recipe as they have for the $CH_3F$ recipe. As such, filled-in area charts such as those of FIGS. 2–4 are not yet available for the $CH_2F_2$ recipe. Nonetheless there is sufficient data to identify some useful parameters for the $CH_2F_2$ recipe. Table-3C shows results in terms of actual flow while Table-3D shows results normalized into terms of mole fractions. Experiment run numbers 2, 3, and 7 showed the most promising results in terms of providing both high SiN etch rate and high SiN/SiO selectivity. Note that run number 11 provides good selectivity but a relatively low nitride etch rate. The obtained results were deemed sufficient to isolate the 6-sided region of FIG. 6 as a more promising region of operation and to exclude outside areas as less promising. If the nitride etch rate was too low (e.g., less than 100 Å/min), the remainder of the data was not filled in Table-3C and Table-3D as indicated by the double hyphens. Of experiment run numbers 2, 3, and 7, run number 7 is considered best because it provides both the highest selectivity and the highest nitride etch rate.

TABLE 3C $CH_2F_2$ Results in SCCM Terms

| RUN # | $CF_4$ (sccm) | $O_2$ (sccm) | $CH_2F_2$ (sccm) | SiN ER (Å/min) | SiO ER (Å/min) | Nitride/Oxide Selectivity |
|---|---|---|---|---|---|---|
| 1 | 277 | 0 | 173 | 4.8 | 13.6 | 0.3 |
| 2 | 277 | 77 | 97 | 2120 | 2.4 | 872 |
| 3 | 221 | 133 | 97 | 4086 | 48.8 | 83.7 |
| 4 | 221 | 0 | 230 | 6.6 | 0 | — |
| 5 | 164 | 133 | 153 | 224 | 3.8 | 59.7 |
| 6 | 164 | 77 | 209 | 6.6 | — | — |
| 7 | 108 | 189 | 153 | 4526 | 32.9 | 137.4 |
| 8 | 108 | 77 | 266 | 6.8 | — | — |
| 9 | 164 | 189 | 97 | 398 | 22.5 | 17.7 |
| 10 | 164 | 0 | 286 | 7.1 | — | — |
| 11 | 108 | 133 | 209 | 328 | 0.8 | 424 |
| 12 | 108 | 0 | 342 | 7.4 | — | — |
| 13 | 52 | 133 | 266 | 8.3 | — | — |
| 14 | 52 | 189 | 209 | 57.9 | — | — |
| 15 | 52 | 77 | 322 | 7.5 | — | — |
| 16 | 52 | 0 | 398 | 8.0 | — | — |
| 17 | 333 | 0 | 117 | 5.9 | — | — |
| 18 | 323 | 77 | 50 | 91.7 | — | — |
| 19 | 268 | 133 | 50 | 2004 | 48.9 | 41.0 |
| 20 | 211 | 189 | 50 | 2494 | 92.6 | 26.9 |
| 21 | 401 | 0 | 50 | 6.0 | — | — |
| 22 | 0 | 0 | 450 | 8.4 | — | — |
| 23 | 221 | 77 | 153 | 9.0 | — | — |

$CF_4$ max contribution to total flow: 401 sccm; and min contribution: 52. $O_2$ max contribution to total flow: 189 sccm; and min contribution: 0. $CH_2F_2$ max contribution to total flow: 450 sccm; and min contribution: 50.

TABLE 3D $CH_2F_2$ Normalized Results

| RUN # | $CF_4$ (mole frac) | $O_2$ (mole frac) | $CH_2F_2$ (mole frac) | SiN ER (Å/min) | SiO ER (Å/min) | Nitride/Oxide Selectivity |
|---|---|---|---|---|---|---|
| 1 | 0.62 | 0.00 | 0.39 | 4.8 | 13.6 | 0.3 |
| 2 | 0.62 | 0.17 | 0.22 | 2120 | 2.4 | 872 |
| 3 | 0.49 | 0.30 | 0.22 | 4086 | 48.8 | 83.7 |
| 4 | 0.49 | 0.00 | 0.51 | 6.6 | 0 | N/A |
| 5 | 0.37 | 0.30 | 0.34 | 224 | 3.8 | 59.7 |
| 6 | 0.37 | 0.17 | 0.47 | 6.6 | — | — |
| 7 | 0.24 | 0.42 | 0.34 | 4526 | 32.9 | 137.4 |
| 8 | 0.24 | 0.17 | 0.59 | 6.8 | — | — |
| 9 | 0.37 | 0.42 | 0.22 | 398 | 22.5 | 17.7 |
| 10 | 0.37 | 0.00 | 0.64 | 7.1 | — | — |
| 11 | 0.24 | 0.30 | 0.47 | 328 | .8 | 424 |
| 12 | 0.24 | 0.00 | 0.76 | 7.4 | — | — |
| 13 | 0.12 | 0.30 | 0.59 | 8.3 | — | — |
| 14 | 0.12 | 0.42 | 0.47 | 57.9 | — | — |
| 15 | 0.12 | 0.17 | 0.72 | 7.5 | — | — |
| 16 | 0.12 | 0.00 | 0.89 | 8.0 | — | — |
| 17 | 0.74 | 0.00 | 0.26 | 5.9 | — | — |
| 18 | 0.72 | 0.17 | 0.11 | 91.7 | — | — |
| 19 | 0.60 | 0.30 | 0.11 | 2004 | 48.9 | 41.0 |
| 20 | 0.47 | 0.42 | 0.11 | 2494 | 92.6 | 26.9 |
| 21 | 0.89 | 0.00 | 0.11 | 6.0 | — | — |
| 22 | 0.00 | 0.00 | 1.00 | 8.4 | — | — |
| 23 | 0.49 | 0.17 | 0.34 | 9.0 | — | — |

The above disclosure is to be taken as illustrative of the invention, not as limiting its scope or spirit. Numerous modifications and variations will become apparent to those skilled in the art after studying the above disclosure.

By way of example, although the proven recipes consist essentially of $CH_3F/CF_4/O_2$ or $CH_2F_2/CF_4/O_2$, it is also expected that a four-part, $CH_3F/CH_2F_2/CF_4/O_2$ recipe will work and provide finer control over the concentration of $CH_3F^*$ and $CHF_2^*$ and $F^*$ radicals present in the plasma.

Also inert gases such as Ar or He may be admixed although this is not seen to provide benefit because the mass production cost is increased by need for additional gases and mass production reliability is decreased by the increased number of control mechanisms added for the increased number of input gases.

By way of example, it is within the contemplation of the invention to use a first recipe having a higher nitride etch rate during etching of a bulk upper portion of the SiN layer and to switch to a second recipe having a lower nitride etch rate but higher selectivity for nitride during etching of a minor lower portion of the SiN layer. Process control computer 180 may be programmed to automatically define the recipe parameters as etching proceeds through the bulk upper portion of the SiN layer and into the minor lower portion of the SiN layer.

What is claimed is:

1. An etch method for etching a supplied first material layer consisting essentially of a silicon nitride, said method comprising the steps of:
   (a) supplying an input gas including at least one of $CH_3F$ and $CH_2F_2$ and further including $CF_4$ and $O_2$ to a vicinity spaced away from the material layer;
   (b) applying electromagnetic energy to the supplied input gas so as to form a plasma; and
   (c) applying an outflow of the formed plasma to said first material layer.

2. An etch method according to claim 1 wherein said input gas consists essentially of $CH_3F$ and $CF_4$ and $O_2$.

3. An etch method according to claim 2 wherein the total flow rate of said input gas is in the range of about 350 sccm to about 600 sccm.

4. An etch method according to claim 3 wherein the $CH_3F$ component of the input gas has a mole fraction contribution to the input gas in the range of about 0.12 to about 0.22.

5. An etch method according to claim 4 wherein the $O_2$ component of the input gas has a mole fraction contribution to the input gas in the range of about 0.32 to about 0.55.

6. An etch method according to claim 5 wherein the $CF_4$ component of the input gas has a mole fraction contribution to the input gas in the range of about 0.30 to about 0.48.

7. An etch method according to claim 1 wherein said input gas includes an inflow of $CH_3F$ in the range of about 42 sccm to about 132 sccm.

8. An etch method according to claim 7 wherein said input gas includes an inflow of $O_2$ in the range of about 112 sccm to about 330 sccm.

9. An etch method according to claim 8 wherein said input gas includes an inflow of $CF_4$ in the range of about 105 sccm to about 288 sccm.

10. An etch method according to claim 1 wherein said input gas consists essentially of $CH_2F_2$ and $CF_4$ and $O_2$.

11. An etch method according to claim 10 wherein the total flow rate of said input gas is in the range of about 350 sccm to about 600 sccm.

12. An etch method according to claim 11 wherein the $CH_2F_2$ component of the input gas has a mole fraction contribution to the input gas in the range of about 0.12 to about 0.48.

13. An etch method according to claim 12 wherein the $O_2$ component of the input gas has a mole fraction contribution to the input gas in the range of about 0.3 to about 0.65.

14. An etch method according to claim 13 wherein the $CF_4$ component of the input gas has a mole fraction contribution to the input gas in the range of about 0.1 to about 0.4.

15. An etch method according to claim 1 wherein said input gas includes an inflow of $CH_2F_2$ in the range of about 42 sccm to about 288 sccm.

16. An etch method according to claim 15 wherein said input gas includes an inflow of $O_2$ in the range of about 105 sccm to about 390 sccm.

17. An etch method according to claim 16 wherein said input gas includes an inflow of $CF_4$ in the range of about 35 sccm to about 240 sccm.

18. An etch method according to claim 1 wherein said plasma is spaced apart from the material layer.

* * * * *